United States Patent [19]
Vine et al.

[11] Patent Number: 5,334,462
[45] Date of Patent: Aug. 2, 1994

[54] CERAMIC MATERIAL AND INSULATING COATING MADE THEREOF

[75] Inventors: Raymond W. Vine, East Hartford; Neal P. Anderson, South Windsor, Conn.

[73] Assignee: United Technologies Corporation, Hartford, Conn.

[21] Appl. No.: 75,870

[22] Filed: Jun. 11, 1993

Related U.S. Application Data

[63] Continuation of Ser. No. 404,715, Sep. 8, 1989, abandoned.

[51] Int. Cl.$^5$ .............................................. C04B 35/48
[52] U.S. Cl. ................................. 428/697; 106/286.1; 106/286.8; 501/152; 428/701; 428/702
[58] Field of Search ................ 501/134, 152; 428/697, 428/701, 702; 106/286.1, 286.8

[56] References Cited

U.S. PATENT DOCUMENTS

| | | | |
|---|---|---|---|
| 2,434,236 | 1/1948 | Verweg et al. | 501/134 |
| 4,194,917 | 3/1980 | Sakemi et al. | 501/152 |
| 4,465,778 | 8/1984 | Brook et al. | 501/152 |
| 4,525,464 | 6/1985 | Claussen et al. | 501/152 |
| 4,593,007 | 6/1986 | Novinski | 501/134 |
| 4,599,270 | 7/1986 | Rangaswamy et al. | 501/152 |
| 4,610,967 | 9/1986 | Imanishi et al. | 501/134 |
| 4,659,680 | 4/1987 | Guile | 501/152 |
| 4,690,910 | 9/1987 | Tsu Kuma et al. | 501/152 |
| 4,891,343 | 1/1990 | Quadair | 501/152 |

OTHER PUBLICATIONS

Wang, D. Y. and Nowick, A. S. "The Grain-Boundary Effect in Doped Ceria Solid Electrolytes" *Journal of Solid State Chemistry* vol. 35 (1980), pp. 325-333.

Steele, B. C. H. and Floyd, J. M. *The Oxygen Self-diffusion and Electrical Transport Properties of Non-stoicheiometric Ceria and Ceria Solid Solutions* Metallurgy Department, Imperial College, London S.W.7. pp. 55-76.

Cales, B. and Baumard, J. F. "Transport Properties and Defect Structure of Nonstoichiometric Yttria Doped Ceria" *Journal of Physical Chemical Solids* vol. 45 (1984), pp. 929-935.

Dragoo, A. L. and Chiang, C. K. *Microstructure and Electrical Properties of Ceria-Based Ceramic Electrolytes,* National Bureau of Standards, Washington, D.C., pp. 268-281.

Dragoo, A. L. and Domingues, L. P. *Preparation of High-Density Ceria Yttria Ceramics,* Gaithersburg, Maryland (May 1982), pp. 253-257.

*Primary Examiner*—A. A. Turner
*Attorney, Agent, or Firm*—Charles E. Sohl

[57] ABSTRACT

A yttria strengthened ceria material is disclosed. The addition of a small amount of yttria (for example 0.5%) significantly strengthens the ceria. The yttria modified ceria is useful as a thermal barrier coating.

4 Claims, No Drawings

CERAMIC MATERIAL AND INSULATING COATING MADE THEREOF

This invention was made with Government support under Navy contract N00140-86-C-9129. The Government has certain rights in this invention.

This is a continuation of copending application Ser. No. 07/404,715 filed on Sep. 8, 1989, now abandoned.

TECHNICAL FIELD

This invention relates to the field of ceramic materials and to the field of insulating ceramic thermal barrier coatings.

BACKGROUND ART

Ceramic materials are widely used in applications where high temperatures are encountered. Frequently ceramic materials are used to provide thermal insulation in high temperature application.

One particularly significant use is in the field of gas turbine engines wherein ceramic thermal barrier coatings are increasingly employed to protect turbine components from high temperature environments thereby extending component lives and permitting enhanced fuel economy.

A selection of patents relating to gas turbine engine thermal barrier coating systems includes U.S. Pat. Nos. 4,248,940, 4,414,249, and 4,055,705; many similar patents have also issued. Some patents (see for example U.S. Pat. No. 3,975,165) use of ceria as a ceramic thermal barrier material although apparently no patent has focused on ceria or illustrated the practical investigation or application of ceria as a thermal barrier coating.

DISCLOSURE OF INVENTION

According to the present invention ceria, containing minor amounts of yttria, is disclosed as a ceramic material having particular application where thermal insulation is important. Ceria containing approximately one-half percent yttria has been found to have a room temperature hardness which is at least twice that of pure ceria. The yttria strengthens the ceria improving both hardness (abrasion resistance) and toughness (thermal shock resistance).

Such yttria strengthened ceria can be applied by several techniques including electron beam vapor deposition and plasma spraying. The yttria strengthened ceria is a single phase material as determined by x-ray analysis. Yttria strengthened ceria appears to have a thermal conductivity which is about one-half that of the previously used yttria strengthened zirconia.

The foregoing and other features and advantages of the present invention will become more apparent from the following description.

BEST MODE FOR CARRYING OUT THE INVENTION

According to the present invention ceria strengthened with a minor amount of yttria has been found to possess the properties required of a insulating ceramic material and especially ceramic material to be used in a thermal barrier coating.

Material composition limits are not well defined. Initial testing was performed using ceria strengthened with 9 wt. % yttria was applied by electron beam vapor deposition. Upon subsequent analysis both by wet chemical methods and by x-ray techniques, the coatings deposited were found to contain only about 0.5 wt. % yttria. The question of why this occurred is not entirely understood. Subsequent discussion of this material will refer to yttria concentrations based on the analysis of the deposited material rather than the analysis of the starting material unless otherwise specified.

The room temperature hardness of ceria without yttria is approximately 120 VHN (Vickers Hardness Number) as measured by the Vickers hardness technique using a 500 gram load. The range of hardnesses measured in pure ceria is from about 110 to about 130 VHN. Material containing nominally one-half percent yttria as deposited from starting material of 9 wt. % yttria displays hardnesses which range from 290 to 370. There is some suggestion that lower yttrium contents are associated with higher room temperature hardnesses although this effect is not pronounced. The strong influence of yttria on the hardness of ceria is surprising and unexpected.

X-ray analysis of material deposited starting from 9 wt. % yttria strengthened ceria revealed that the deposited material had approximate overall composition of one-half percent yttria balance ceria. The nature of the deposited layer as viewed optically is that it has layers which vary in yttria concentration from less than 0.1% to about 1.0%. The cause of the layered coating structure is not entirely understood.

X-ray analysis shows that the material deposited by electron beam physical vapor deposited from a starting composition of 9 wt. % yttria strengthened ceria is entirely a single phase material at room temperature.

Material containing one-half percent yttria balance ceria was exposed in air at 2600° F. for 168 hours and at the end of that time there had been no detectable change in the structure or composition of the material. In contrast, exposure under the same conditions of the 7 wt. % yttria strengthened zirconia used in the prior art caused destabilization and microstructural changes.

The present material will most commonly be applied over an MCrAlY bond coat as discussed in U.S. Pat. Nos. 4,248,940, and 4,414,249 (in MCrAlY materials, M stands for iron, nickel and cobalt and mixtures thereof). Such a bond coat is a layer of metallic material applied over the superalloy substrate forms an adherent oxide layer and thereby improves the adherence of the subsequently applied ceramic layer to the substrate. It is possible, however, that certain advanced superalloys now under development which contain reactive elements and may permit the elimination of such a bond coat requirement.

If used, the bond coat will typically have a thickness of from about 2 to about 10 mils and the ceramic coating will range from about 1 to about 20 mils in thickness and preferably from about 2 to about 10 mils in thickness and most preferably from about 2 to about 5 mils in thickness for rotating components such as turbine blades and from about 5 to about 10 mils in thickness for stationery components such as turbine vanes.

As indicated, the only material according to the invention which has been thoroughly characterized contained one-half percent yttria despite having been deposited from a starting material which contained 9% yttria. The range of material which will produce the desired benefits is believed to be broadly defined on a compositional basis as from about 0.1 to about 5 wt. % and preferably from about 0.2 to about 2 wt. % as measured in the deposited material. A functional definition would be that the present invention composition limits range from that required to produce a 50% increase in room temperature hardness as measured by the Vickers hardness method using a 500 gram load up to the solid solubility limit of yttria and ceria. This later definition means that the deposited coating must be a single phase at room temperature and at the operating temperatures for which the coating is intended.

Material may be applied by electron beam vapor deposition as described in U.S. Pat. No. 4,414,249 or by plasma spraying or flame spraying. The investigations to date which have used the electron beam physical vapor deposition technique have resulted in the marked decrease in the yttria content of the material. It is anticipated that if plasma or flame spraying were to be employed this decrease in yttria content would be much reduced so that the starting materials would most preferably have a composition quite similar to that of the desired actual coating composition.

Although this invention has been shown and described with respect to detailed embodiments thereof, it will be understood by those skilled in the art that various changes in form and detail thereof may be made without departing from the spirit and scope of the claimed invention.

We claim:

1. A hard insulating single phase ceramic material consisting essentially of ceria and an amount of yttria sufficient to increase the room temperature hardness by at least 50% over the room temperature hardness of ceria when measured according to the Vickers Hardness test using a 500 gram load.

2. A material as in claim 1 wherein sufficient yttria is added to increase the room temperature Vickers hardness by at least 100%.

3. Material as in claim 1 containing from about 0.1 to about 5 wt. % yttria.

4. Material as in claim 1 containing from about 0.2 to about 2 wt. % yttria.

* * * * *